United States Patent [19]
Nishitani et al.

[11] Patent Number: 6,023,020
[45] Date of Patent: Feb. 8, 2000

[54] SOLAR CELL AND METHOD FOR MANUFACTURING THE SAME

[75] Inventors: Mikihiko Nishitani, Nara; Takayuki Negami, Osaka; Naoki Kohara, Osaka; Takahiro Wada, Osaka; Yasuhiro Hashimoto, Kyoto, all of Japan

[73] Assignee: Matsushita Electric Industrial Co., Ltd., Osaka, Japan

[21] Appl. No.: 08/950,204

[22] Filed: Oct. 14, 1997

[30] Foreign Application Priority Data

Oct. 15, 1996 [JP] Japan .................................. 8-271960
Jun. 5, 1997 [JP] Japan .................................. 9-148230

[51] Int. Cl.$^7$ ..................... H01L 31/0336; H01L 31/032
[52] U.S. Cl. ......................... 136/255; 136/260; 136/262; 136/264; 136/265; 438/84; 438/85; 438/86; 438/87; 438/89; 438/95; 257/461; 257/465; 257/466
[58] Field of Search ..................... 136/255, 260, 136/262, 264, 265; 438/84, 85, 86, 87, 89, 95; 257/461, 465, 466

[56] References Cited

U.S. PATENT DOCUMENTS

| | | | |
|---|---|---|---|
| 4,612,411 | 9/1986 | Weiting et al. | 136/265 |
| 5,078,804 | 1/1992 | Chen et al. | 136/260 |
| 5,479,939 | 12/1995 | Pollock et al. | 136/265 |

OTHER PUBLICATIONS

Kushiya et al, "The Role of Cu(InGa)(SeS)2 Surface Layer on a Graded Band–Gap Cu(InGa)Se2 Thin–Film Solar Cell Prepared by Two–Stage Method," 25th IEEE PVSC, Hyatt Regency Crystal City, Washington, DC, May 1996.
K.O. Velthaus et al., "Novel Buffer Layers for the CuInSe$_2$/Buffer/ZnO Devices", 11th E.C. Photovoltaic Solar Energy Conference, Oct. 12–16, 1992, pp. 842–845.
H.W. Schock et al., "High Efficiency Chalcopyrite Based Thin Film Solar Cells—Results of the Eurocis–Collaboration", 11th E.C. Photovoltaic Solar Energy Conference, pp. 116–119, Oct. 1992.
H.W. Bloss et al., "Thin–Film Solar Cells", *Progress in Photovoltaics: Research and Applications*, vol. 3, pp. 3–24, 1995 (month Unknown).
Ji–Beom Yoo et al. "Preparation and Properties of CuInSe$_2$ Solar Cells with a ZnSe Intermediate Layer" Twentieth IEEE Photovoltaic Specialists Conference, pp. 1431–1436, Sep. 1988.
S.K. Deb "Current Status of Thin Film Solar Cell Research at Seri" *Thin Solid Films*, vol. 163, pp. 75–84, Sep. 1988.
A.G. Fitzgerald et al. "A microbeam analysis study of heterojunctions formed with CuInS$_2$ and CuInSe$_2$," *Solar Energy Materials*, vol. 22, pp. 43–61, Mar. 1991.
Communication from European Patent Office and attached Search Report, Feb. 6, 1999.

*Primary Examiner*—Alan Diamond
*Attorney, Agent, or Firm*—Merchant & Gould, P.C.

[57] ABSTRACT

A solar cell utilizing a chalcopyrite semiconductor and reducing the density of defects on the junction interface of pn junctions is provided. This solar cell includes a substrate, a back electrode formed on the substrate, a p-type chalcopyrite semiconductor thin film formed on the back electrode, an n-type semiconductor thin film formed so as to constitute a pn junction with the p-type chalcopyrite semiconductor thin film, and a transparent electrode formed on the n-type semiconductor thin film. A material having a higher resistivity than the p-type chalcopyrite semiconductor is formed between the p-type chalcopyrite semiconductor thin film and the n-type semiconductor thin film. A thin film made of this material may be formed by deposition from a solution. For example, CuInS$_2$ is formed on the surface of a p-type chalcopyrite based semiconductor such as CuInSe$_2$ by contacting the surface of the semiconductor with a solution in which a salt containing group IIIb elements, an organic substance containing group VIb elements and acid are mixed.

33 Claims, 10 Drawing Sheets

SOLAR CELL AND METHOD FOR MANUFACTURING THE SAME

FIELD OF THE INVENTION

The present invention relates to a solar cell and a method for manufacturing the same and, more specifically, to a thin film solar cell having high energy conversion efficiency containing a compound semiconductor, and a method for manufacturing the same.

BACKGROUND OF THE INVENTION

Thin film solar cells show high energy conversion efficiency and have little deterioration in efficiency due to light irradiation or the like when $CuInSe_2$ (CIS), i.e. a compound semiconductor thin film (chalcopyrite based semiconductor thin film) containing group Ib elements, group IIb elements and group VIb elements, or $Cu(In,Ga)Se_2$ (CIGS), in which Ga is dissolved in $CuInSe_2$, is used as a light absorbing layer in the solar cells. The solar cells containing the above-mentioned compound semiconductor are explained in detail by Bloss et. al. (in "Progress in Photovoltaic". 3 (1955), p. 3). These thin film solar cells have better conversion efficiency when they had a substrate structure such as a glass/back electrode (Mo)/CIS-based thin film or CIGS-based thin film/CdS/transparent conductive film (for example, ZnO/ITO or ZnO/ZnO:Al) structure.

It is well known that the condition of the surface layer of a CIS film or a CIGS film highly influences the conversion efficiency of solar cells. For instance, in CIGS-based solar cells, conversion efficiency is highly dependent on the conditions of a pn junction formed between a p-type CIGS film and a so-called n-type window layer semiconductor, and particularly, is dependent on the conditions of the surface layer (which becomes a pn junction interface) of a CIGS film. Thus, the surface layer of these semiconductor thin films has been focused on in research. At the 11th E.C. Photovoltaic Solar Energy Conference held Oct. 12–16, 1992 in Montreux, Switzerland, H. W. Schock et. al. reported that a $CuIn_3Se_5$ compound layer exists on the surface of a CIS film, which is formed by a deposition method, in the paper titled, "HIGH EFFICIENCY CHALCOPYRITE BASED THIN FILM SOLAR CELLS RESULTS OF THE EUROCIS-COLLABORATION." It was also suggested that this $CuIn_3Se_5$ shows n-type conduction and constitutes a pn junction with the p-type CIS. It can be considered that this surface layer lessens the defects of a pn junction interface and contributes to the high conversion efficiency of CIS-based solar cells.

SUMMARY OF THE INVENTION

The present invention aims to provide a solar cell having pn junction properties that improve photoelectric transfer efficiency, and an excellent method of mass-producing the solar cells.

In order to achieve the above-noticed objects, the solar cell of the present invention consists of a substrate, a back electrode formed on the substrate, a p-type chalcopyrite semiconductor thin film formed on the back electrode, an n-type semiconductor thin film formed so as to constitute a pn junction with the p-type chalcopyrite semiconductor thin film, and a transparent electrode formed on the n-type semiconductor thin film, wherein a material having a higher resistivity than the p-type chalcopyrite semiconductor is formed between the p-type chalcopyrite semiconductor thin film and the n-type semiconductor thin film.

The solar cell of the present invention improves the junction properties of grain boundaries on the surface of the p-type chalcopyrite semiconductor thin film, thereby reducing leakage current and thus increasing conversion efficiency.

In addition, the method of manufacturing the solar cell of the present invention includes the steps of:

forming a back electrode on a substrate;

forming a p-type chalcopyrite containing group Ib elements, group IIIb elements and group VIb elements on the back electrode;

forming a material, which has a higher resistivity than the p-type chalcopyrite semiconductor, on the p-type chalcopyrite semiconductor thin film;

forming an n-type semiconductor thin film so as to constitute a pn junction with the p-type chalcopyrite semiconductor layer; and forming a transparent electrode on the n-type semiconductor thin film;

wherein the above-noted material is formed by contacting a solution, which is the mixture of a compound containing group IIIb elements and a compound containing group VIb elements, with the surface of the p-type chalcopyrite semiconductor thin film.

The method for manufacturing the solar cell of the present invention is excellent for mass-producing and reproducing thin film solar cells that have improved junction properties at the grain boundaries on the surface of the p-type chalcopyrite semiconductor thin film.

DETAILED DESCRIPTION OF THE PREFERRED EMBODIMENTS

The preferred embodiments of the present invention are now explained using the Figures.

Figure 1:
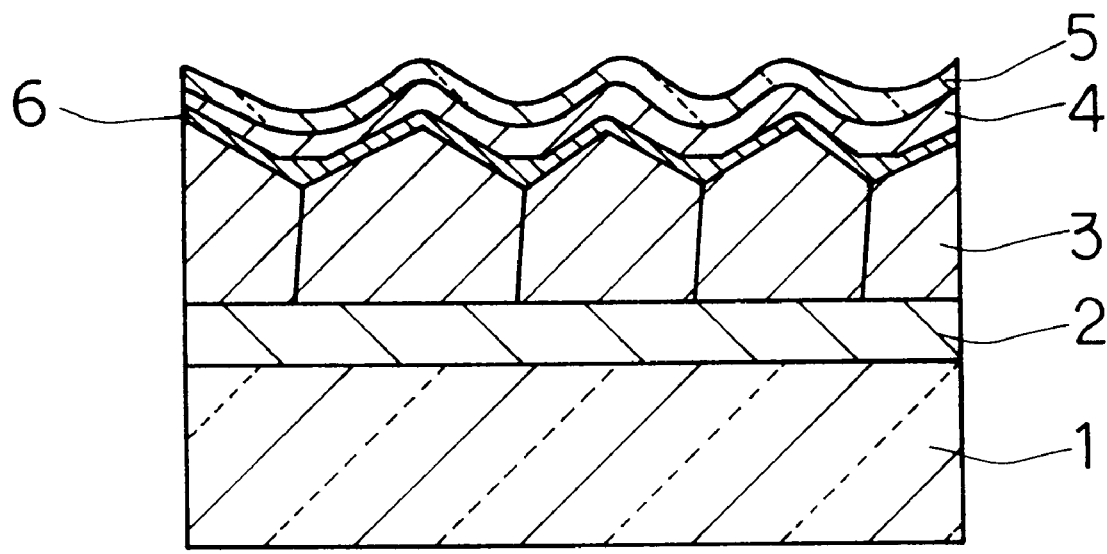
FIG. 1 is a cross-sectional view of an embodiment of the structure of the solar cell of the present invention.

As shown in FIG. 1, an embodiment of a solar cell of the present invention includes a glass substrate 1, a Mo electrode formed on the glass substrate 1 as a bottom electrode 2, a light absorbing layer 3 formed on the Mo electrode, a so-called window layer 4 formed on the light absorbing layer 3, and a transparent conductive film 5 formed on the window layer.

The Mo electrode 2 is preferably about 1 µm thick. An about 2 µm thick $Cu(In,Ga)Se_2$ thin film is suitable for the light absorbing layer 3. However, the material of the light absorbing layer is not limited to this film, and it is also possible to use another p-type chalcopyrite semiconductor thin film. This semiconductor film can be generally expressed as $ABC_2$ (where A=at least one element selected from Cu and Ag; B=at least one element selected from In, Ga and Al; and C=at least one element selected from S, Se and Te). The window layer 4 forms a pn junction between itself and the light absorbing layer 3, and it is preferable that the material of the window layer has a much larger band gap than the light absorbing layer and provides preferable junction interface properties. Thus, it is preferable that the material contains, for example, CdS. A CdS thin film (of around 0.05 µm thickness or less)/ZnO thin film (of about 0.05–0.3 µm thickness) is one of the suitable structures for the window layer. The transparent conductive film 5 is preferably an ITO thin film or ZnO thin film to which group IIIb elements (such as B, Al and Ga) are doped. The thickness of the transparent conductive film 5 should be designed to provide about 10 Ω value of sheet resistance. For instance, the ITO thin film should be about 0.1 µm thick; and the thickness of ZnO to which the group IIIb elements are doped should be around 1 µm.

Figure 2:
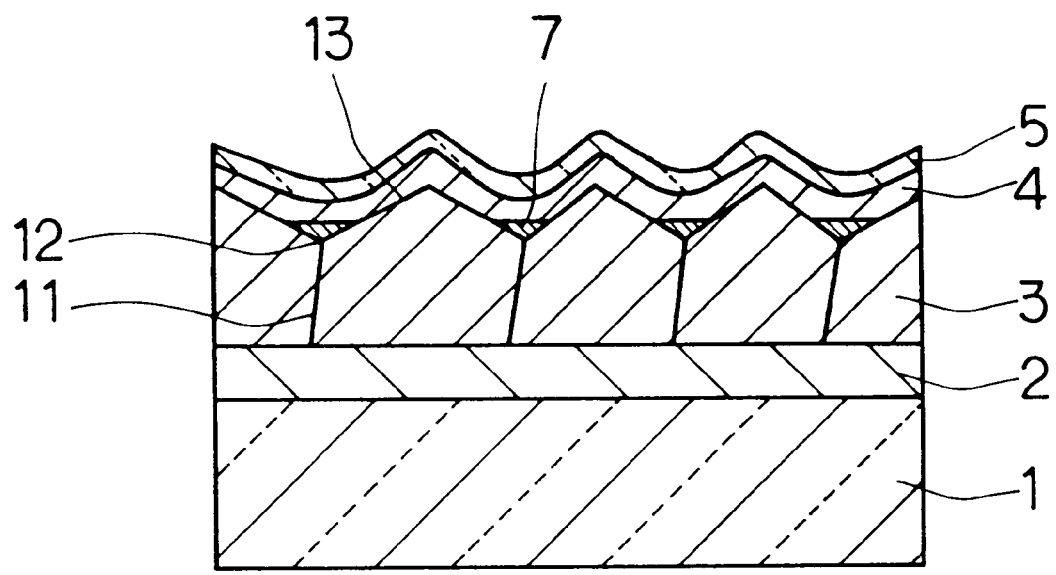
FIG. 2 is a cross-sectional view of another embodiment of the structure of the solar cell of the present invention.

Between the light absorbing layer 3 and the window layer 4, a high-resistance thin film 6 is formed. The high-resistance thin film is made of a material having a higher resistivity than at least the p-type chalcopyrite semiconductor, and is thus mentioned as a "high-resistance" thin film in this specification. The high-resistance thin film 6 may be formed on the entire surface of the light absorbing layer 3 as shown in FIG. 1, or may be formed in an island pattern at sections including sections 12 where grain boundaries 11 are exposed to the surface as shown in FIG. 2. By covering the grain boundaries with the high resistance material 7, junction properties improve, thus reducing leakage current. At the grain boundary surface sections 12, the high resistance material 7 formed by e.g., a vapor deposition method, is likely to start growing. However, it is more preferable to choose a material as the high-resistance material 7 which is apt to start growing from sections 12. $CuInS_2$—particularly, $CuInS_2$ with a slight excess of In over the stoichiometric ratio—is useful since it is prone to grow selectively and exclusively at the grain boundary surface sections 12, and is also "high-resistance."

The high resistance material may be formed by a multi-source vapor deposition method. For example, each of Cu, In and S is vaporized from its own source composed of the respective element at the same time for about half a minute while the substrate is kept at a temperature of about 550° C.; the Cu-source is kept at about 1140° C.; the In-source is kept at about 850° C.; and the S-source is kept at about 55° C., thus forming a preferable $CuInS_2$ layer.

A p-type chalcopyrite semiconductor is generally preferable as a high-resistance material. As described above, this semiconductor can be expressed as $ABC_2$ (where A=at least one element selected from Cu and Ag; B=at least one element selected from In, Ga and Al; and C=at least one element selected from S, Se and Te). For this chalcopyrite based semiconductor a thin film such as $CuInS_2$ $CuGaS_2$ or the mixed crystal of these materials may be used. Also, group IIb elements such as Zn and Cd or group IVb elements such as Sn may be doped into the chalcopyrite based semiconductor.

Figure 3:
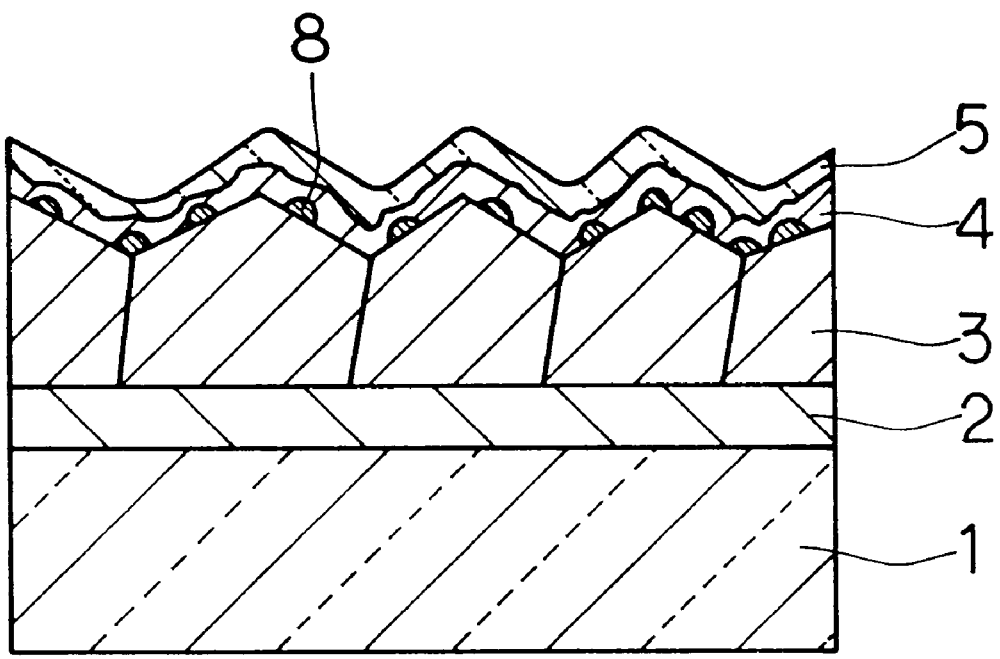
FIG. 3 is a cross-sectional view of another embodiment of the structure of the solar cell of the present invention.

The method of forming the high-resistance material is not limited to the methods illustrated in FIG. 1 and FIG. 2. As shown in FIG. 3, the high resistance material 8 may be formed simply in an island pattern. Furthermore, the high-resistance material is not limited to the above-mentioned material; for example, $Al_2O_3$, $TiO_2$, $SiO_2$, ZnO, $ZrO_2$, $Si_3N_4$, $CaF_2$, $MgF_2$, AlN or a mixture of these materials can also be used.

It is preferable that the high-resistance material formed in a thin film condition or in an island pattern has a resistivity of $10^4$ Ω·cm or above. The resistivity of a high-resistance material is more preferably $10^5$ Ω·cm or above. If a high-resistance material is formed in a thin film condition as shown in FIG. 1, its thickness would be preferably 40 nm or less. It would be more preferable if the film thickness is 20 nm or less.

Figure 4:
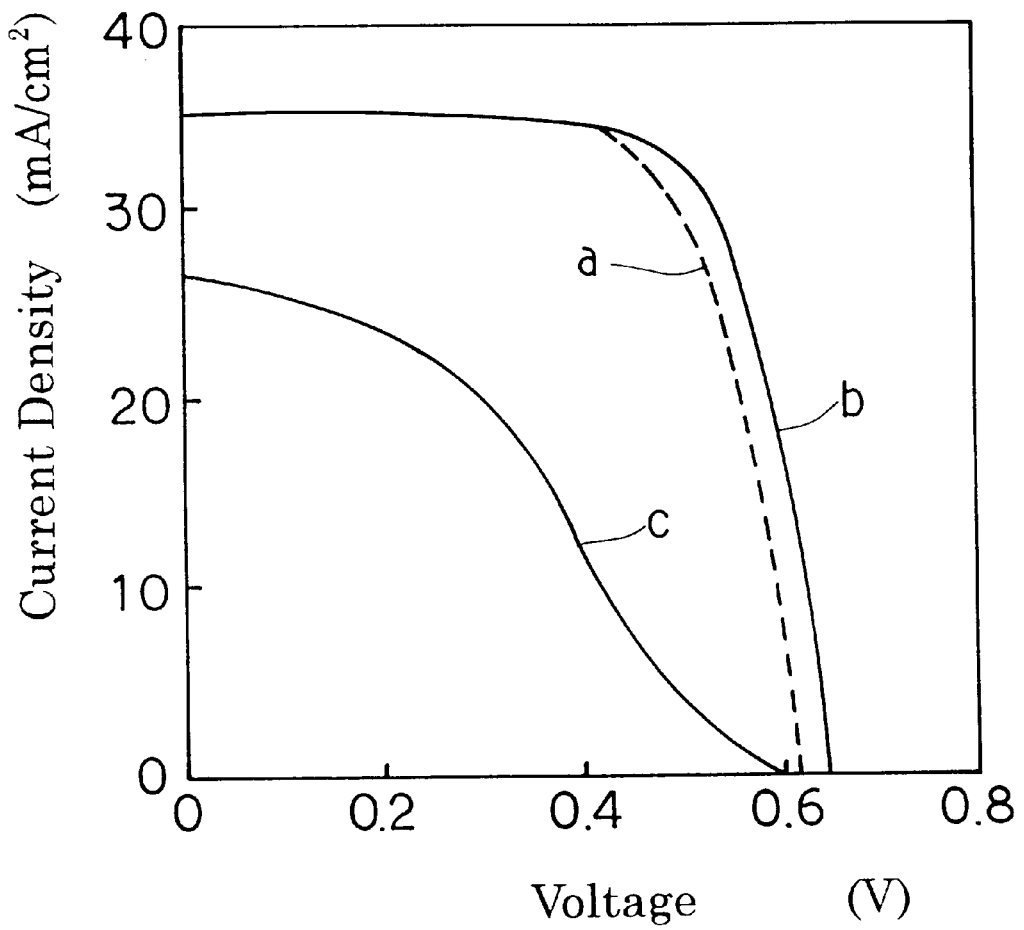
FIG. 4 is a graph showing the properties of a solar cell of the present invention and of a conventional solar cell.

FIG. 4 shows an example of the properties (b) of a solar cell having the structure shown in FIG. 1 and an example of the properties (a) of a conventional solar cell having no high-resistance thin film 6. The properties (b) are obtained from selecting the above-mentioned preferable materials and thickness for the substrate and each layer; and the conventional solar cell having the properties (a) has the same structure as the solar cell having the properties (b), except that it has no high-resistance thin film 6. As the high-resistance thin film 6, an about 10 nm thick $CuInS_2$ thin film was used.

Figure 5:
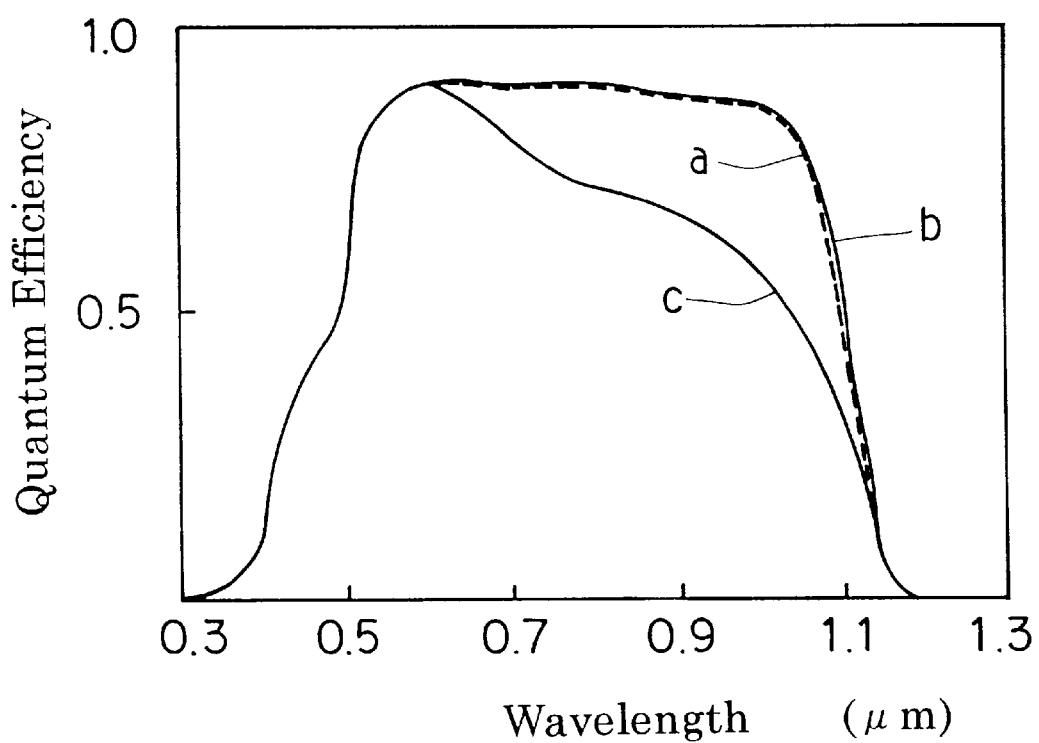
FIG. 5 is a graph showing a correlation between wavelength and the quantum efficiency of a solar cell of the present invention and of a conventional solar cell.

As shown in FIG. 4, (a) shows 15.0% conversion efficiency (Jsc=35.0 mA/cm², Voc=0.617 V, and FF=0.696) while (b) shows 16.1% conversion efficiency (Jsc=35.0 mA/cm², Voc=0.648 V, and FF=0.710). Particularly, the properties (b) showed a significant improvement in Voc. As a comparison, the properties (c) of a solar cell are also shown in the graph. This solar cell is the same as the solar cell having the properties (b), except that its high-resistance thin film 6 is about 50 nm thick instead of about 10 nm thick. Furthermore, a correlation between wavelength and the quantum efficiency of these solar cells is shown in FIG. 5. When the high-resistance thin film is about 50 nm thick (in case of the properties (c)), it is found that the quantum efficiency deteriorates in a long-wavelength range.

The relation between the thickness of the high-resistance thin film 6 and the properties of solar cells were researched, and it was confirmed that the same preferable results as the properties (b) can be obtained particularly when the high-resistance thin film is 10nm thick or less.

As described above, a substrate-based thin film solar cell having a p-type chalcopyrite semiconductor thin film has the highest properties as a thin film solar cell; however, it has poorer junction properties around surface sections at grain boundaries (sections 12 in FIG. 2) than surface sections with no grain boundaries (section 13 in FIG. 2), thus generating leakage current at the junction. Thus, it is preferable that a material with high resistivity is formed at least on grain boundary surface sections. Also at sections other than the grain boundary sections, leakage current at a junction is generated by the increase in surface areas due to the concavity and convexity of a thin film surface. In other words, leakage current can be effectively prevented by forming a material with a high resistivity also on non-grain boundary surface sections 13. Therefore, leakage current can be reduced by applying a high-resistance material, so that the properties of solar cells are improved.

Each layer of the solar cell of the present invention generally may be formed from gas by a synthetic method such as a vapor deposition method. However, in consideration of mass-production and reproducibility of solar cells, it is preferable that each layer is instead made from liquid. Described below is a method of manufacturing solar cells of the present invention that forms a high-resistance material on a p-type chalcopyrite semiconductor thin film by a synthetic method in a liquid-phase.

In this method, the surface of a p-type chalcopyrite semiconductor thin film, made of group Ib elements, group IIIb elements and group VIb elements, is contacted with a solution that contains a compound containing group IIIb elements and a compound containing group VIb elements. Thus, a thin film, made of a group Ib element, a group IIIb element and a group VIb element, such as $CuInS_2$ thin film can be formed in this method. Also in this case, the thin film is a "high-resistance" semiconductor thin film, made from a material having a higher resistivity than the p-type chalcopyrite semiconductor.

As described above, the conditions of a semiconductor surface have a major effect on the properties of a solar cell. Particularly, at a pn junction created by forming an n-type film on a p-type semiconductor, the surface of the p-type semiconductor becomes a pn junction interface, so that defects on the surface caused by the adhesion of impurities, oxidation, etc. become a major cause for the deterioration of solar cell properties. In this manufacturing method, a semiconductor surface layer—having a higher resistivity than a p-type semiconductor and, preferably, having a different composition—is formed on the surface of the p-type semiconductor (substrate) by a low temperature process with a solution, thereby limiting solar cell deterioration. By a deposition method in a liquid-phase, a film can be formed at a low temperature of around room temperature, so that manufacturing costs can be reduced. In addition, since a solution is contacted with the entire surface of the semiconductor thin film (substrate), the method can be easily applied to the processes of manufacturing large solar cells and is excellent in controllability and uniformity. Therefore, according to the present invention, highly efficient and uniform thin film solar cells are manufactured by the method that is excellent in mass-production.

Particularly, since a surface layer is formed from a solution, the layer can be formed uniformly even along the convex and concave surfaces. For a solar cell, properties are required to be uniform over a large area, so that a surface layer applied in the manufacturing method of the present invention becomes useful. Particularly, when a polycrystalline chalcopyrite based semiconductor thin film is applied as the light absorbing layer of a solar cell, convex and concave surfaces are formed by the growth of crystal grains as described above. Thus, a semiconductor thin film formed by the manufacturing method of the present invention becomes particularly useful. Furthermore, since a surface layer can be manufactured uniformly, the reproducibility of solar cells also improves.

In addition to the solutes mentioned above, a compound containing group IIb elements may be further added as a solute. As a result, a semiconductor layer, essentially made of group Ib elements, group IIIb elements and group VIb elements and containing group IIb elements as microelements, can be formed on the surface mentioned above. This semiconductor layer is made of group Ib elements, group IIIb elements and group VIb elements to which group IIb elements are doped, and its surface layer becomes mainly an n-type semiconductor. Therefore, at an interface between the semiconductor surface layer and the p-type chalcopyrite based semiconductor thin film, in other words inside the semiconductor thin film, a pn junction is formed. In this composition, the adhesion of impurities to a pn boundary interface or the generation of defects due to oxidation or the like can be prevented, and scratches at a junction interface also can be avoided which are formed in a process after the formation of a pn junction, such as an electrode formation process. As a result, the reproducibility and the yield of a semiconductor device using a pn junction improve.

Similarly, a compound containing group IVb elements may be added to the above-mentioned solution as a solute, so that a semiconductor layer can be formed which it made essentially of group Ib elements, group IIIb elements and group VIb elements and contains group IVb elements as microelements. This semiconductor surface layer becomes mainly an n-type high-resistance semiconductor. Thus, a pin junction can be formed by accumulating an n-type semiconductor film after dipping a p-type chalcopyrite based semiconductor in the above-mentioned solution and then forming an n-type high-resistance layer. When light is irradiated to this pin junction, light is efficiently absorbed not only in the p-type chalcopyrite based semiconductor (light absorbing layer) but also in a semi-insulating surface layer, so that it becomes possible to remove excited carriers outside. With the n-type high-resistance surface layer, leakage current at a pin junction is reduced. As a result, diode properties improve. More specifically, open end voltage and curve factor increase due to the reduction in leakage current in a solar cell, thus improving conversion efficiency.

As described above, it is preferable to use the above-noted materials for other layers such as a conductive film in forming a high-resistance thin film from a solution. For instance, it is preferable to use a CdS thin film for a window layer since it has a small lattice mismatching constant.

More specifically, as elements used for a synthetic method in a liquid-phase, the group Ib element is preferably Cu; the group IIIb element is preferably at least one selected from In and Ga; and the group VIb element is at least one selected from Se and S. From these elements, a chalcopyrite based group I-III-VIb compound semiconductor can be formed.

It is also preferable that an element to be doped is at least one of group IIb elements selected from Zn and Cd, and is Sn for the group IVb element. By doping these elements, it becomes possible to form the pn junction and the pin junction mentioned above.

Furthermore, the group IIIb elements or the group VIb elements contained in the semiconductor layer (surface layer) may be different from the group IIIb elements or the group VIb elements contained in the p-type chalcopyrite based semiconductor thin film (substrate). For instance, by using such a thin structure it becomes possible to form a surface layer having a larger forbidden band width than the forbidden band width inside the semiconductor thin film. Moreover, in constituting a pn or pin junction, leakage current generated from defects at a junction interface can be prevented, and it becomes possible to improve diode properties.

Thus, in considering these effects, it is preferable that the compounds in the solution, applied in the present invention, contain different group IIIb elements from the elements contained in the semiconductor thin film to which this solution is contacted. Similarly, it is preferable that the compounds in the solution contain different group VIb elements from the elements contained in the semiconductor thin film to which the solution is contacted.

Furthermore, the solution used in the present invention preferably contains at least one acid selected from hydrochloric acid, acetic acid, nitric acid and sulfuric acid. It is also preferable that the solution has 1–4 pH. Under these preferable conditions, a semiconductor layer can be stably and rapidly formed in the present invention.

It is preferable that the solution is kept at 10–100° C. Thus, manufacturing costs can be reduced by treatment at low temperature.

It is also preferable that the compound containing group IIIb elements in the solution is at least one selected from the halide, the acetate, the nitrate and the sulfate of group IIIb elements; that the compound containing group VIb elements is a nitrogen organic compound containing group VIb elements; that the compound containing group IIb elements is at least one compound selected from the halide, the acetate, the nitrate and the sulfate of IIb elements; that the compound containing group IVb elements is at least one compound selected from the halide, the acetate, the nitrate and the sulfate of group IVb elements. As the halide, chloride, iodide or bromide is preferable. Furthermore, the nitrogen organic compound containing the group VIb elements is preferably at least one compound selected from thioacetamide and thiourea.

It is also preferable in the present invention that a heat treatment is carried out on the semiconductor thin film after a surface layer is formed. In this preferable example, the density of defects inside the semiconductor surface layer and at the interface between the semiconductor surface layer and the semiconductor thin film (substrate) can be further reduced. As a result, it becomes possible to form a stable pn or pin junction of high quality which generates little leakage current. In order to obtain these effects sufficiently, the heat treatment is preferably carried out at 100–400° C., or more preferably at 200–350° C.

EXAMPLES

Example 1

An example of forming a $CuInS_2$ surface layer on the surface of a $CuInSe_2$ substrate, which is a p-type chalcopyrite based semiconductor, is explained in this example.

First, a solution was prepared in which indium chloride ($InCl_3$)—a compound (salt) containing group IIIb elements—and thioacetamide ($CH_3CSNH_2$)—an organic compound containing group VIb elements—and hydrochloric acid were mixed. The concentration of indium chloride in the solution was 0.005 M; and the concentration of thioacetamide in the solution was 0.1 M. By adding hydrochloric acid, the pH was controlled to be 1.9. A container containing this solution was kept still in a hot water tank kept at 75° C. A $CuInSe_2$ substrate (group I-III-VIb chalcopyrite based semiconductor) was dipped in the solution, and was kept still for about five minutes. Then, the substrate was lifted out and was washed with pure water. The temperature of the solution was 70° C. after the substrate was removed.

Figure 6:
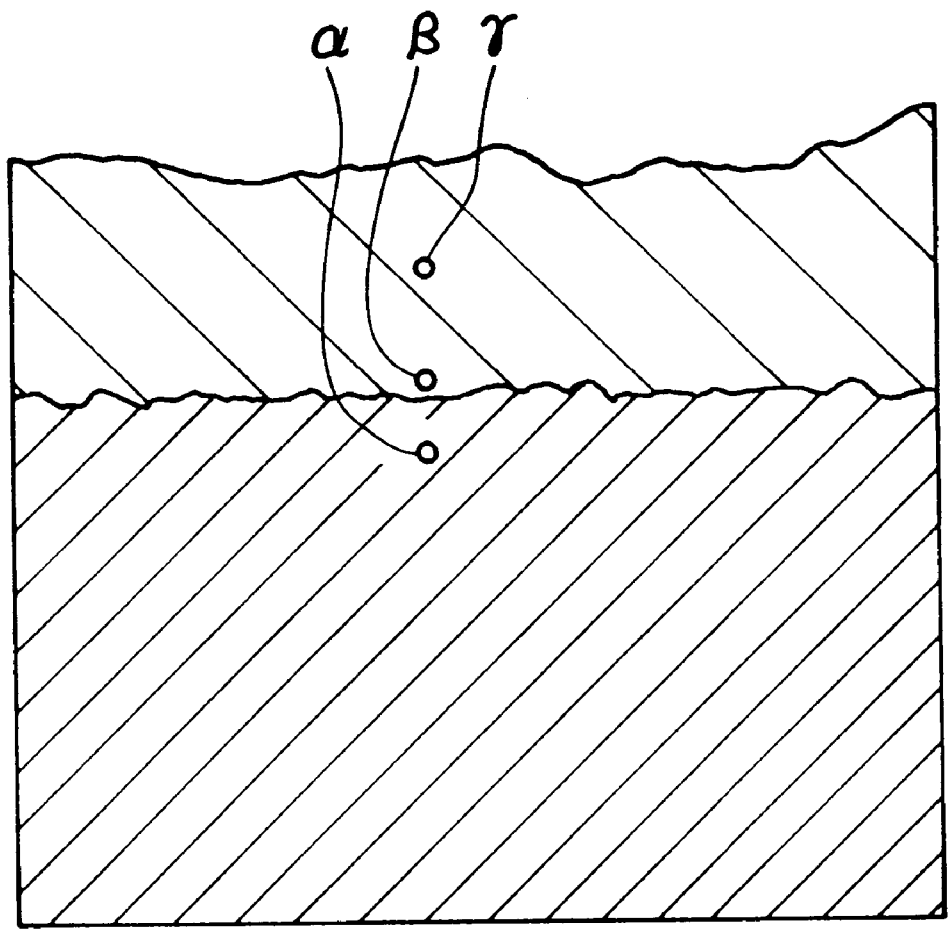
FIG. 6 schematically shows the cross-sectional bright field images observed by a transmission electron microscope (TEM) of a $CuInSe_2$ substrate having a $CuInS_2$ surface layer, formed by an embodiment of the manufacturing method of the present invention.

The cross section of this $CuInSe_2$ substrate was examined by a transmission electron microscope (TEM), and bright field images were found as schematically shown in FIG. 6, where images in the surface layer were brighter than the images inside the crystal. Compositions at two points in this surface layer (point β and point γ shown in FIG. 6) and a point inside the crystal (point α shown in FIG. 6) were measured by a Micro EDX (Energy Dispersing X-ray analysis). Inside the crystal (at point α), the signals of Cu, In and Se were detected respectively, and the composition ratio was 25.0:25.0:50.0 (=Cu:In:Se). Based on these results, it was confirmed that inside the substrate was $CuInSe_2$ crystal. On the other hand, the signals of Cu, In and S were observed respectively in the surface layer, and no Se signals were detected. The composition ratio at point β near the interface was 27.1:26.6:46.2 (=Cu:In:S) and the composition ratio at point γ inside the surface layer was 23.4:26.0:50.6 (=Cu:In:S). Based on these results the surface layer was confirmed to be $CuInS_2$.

Thus, it was confirmed that by dipping and holding a $CuInSe_2$ crystal substrate in a solution containing In and S, a $CuInS_2$ surface layer having a different composition from the substrate would be formed instead of accumulating an In-S based compound film ($In_2S_3$ or the like) on the surface.

Example 2

An example of forming a surface layer by applying a solution that contains two kinds of compounds containing group IIIb elements was described in this example.

As a compound (salt) containing group IIIb elements, indium sulfate ($In_2(SO_4)_3$) and gallium sulfate ($Ga(SO_4)_3$) were prepared. These two salts were dissolved in water, thus preparing an aqueous solution. Then, a solution was prepared in which the aqueous solution, thioacetamide and sulfuric acid were mixed. The concentration of indium sulfate in the solution was 0.004 M; the concentration of gallium sulfate in the solution was 0.001 M; and the concentration of thioacetamide was 0.1 M. By adding sulfuric acid, the pH was controlled to be 2. A container containing this solution was kept still in a hot water tank kept at 75° C. A substrate was prepared in advance that had an accumulated $CuInSe_2$ film on a Mo-coated glass plate. This substrate was dipped in this solution for about one minute, and was then lifted out and washed with pure water.

Figure 7:
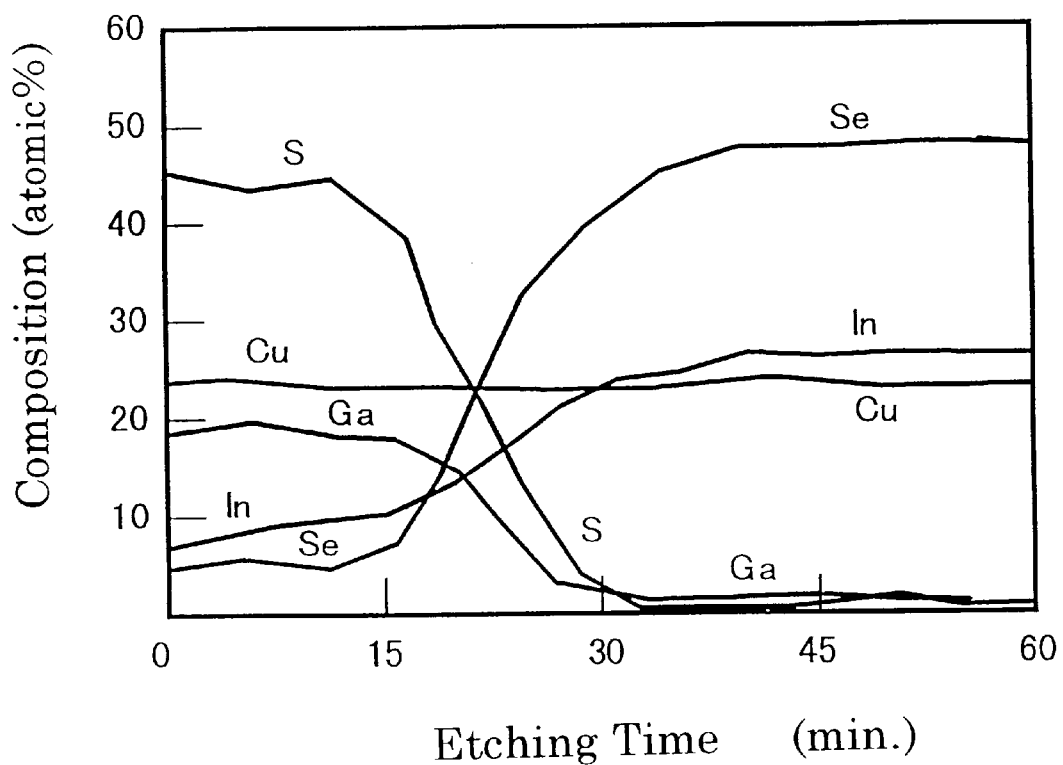
FIG. 7 is a graph showing the changes in compositions in the film depth of a $CuInSe_2$ film having a surface layer, formed by another embodiment of the manufacturing method of the present invention.

The composition of this $CuInSe_2$ film in the film depth was examined by Auger Electron Spectroscopy. The results are shown in FIG. 7. The horizontal axis of FIG. 7 indicates the etching time of the film, and 0 etching time corresponds to the top surface of the film. According to FIG. 7, the signals of Ga and S are observed in the surface layer up to 15-minutes of etching time. On the contrary, the signal strength of Se is extremely weak. Inside the film (bulk), after 15-minutes of etching time, on the other hand, it is found that Ga and S signals are much weaker while Se signals are stronger. Also, In signals are weaker in the surface layer than in the bulk, but there is little difference in Cu signal strength between the bulk and surface layer. Based on these results, it is realized that a $Cu(In,Ga)S_2$ layer is formed on the surface of the $CuInSe_2$ film by dipping the film in the solution.

It was also found that, by changing the concentration ratio of indium sulfate and gallium sulfate in the solution, the signal strength of In and Ga in the surface layer varies, and that the variation is almost in proportion to the change in the concentration ratio. Thus, it was confirmed that the composition of the group IIIb elements in the surface layer can be arranged by changing the concentration ratio of two kinds of salts containing group IIIb elements in the solution.

Although the sulfate was used as the salt containing group IIIb elements, basically the same results are obtained from halide or nitrate. However, since some materials react readily with water or acid, it is industrially important to select a safe salt in preparing a solution.

Example 3

An example of forming a surface layer by using a solution containing group IIb elements is described in this example.

As a compound (salt) containing group IIb elements, zinc chloride ($ZnCl_2$) was used while indium chloride ($InCl_3$) was used as a compound (salt) containing group IIIb elements. These salts were dissolved in water, thus preparing an aqueous solution. Then, a solution was prepared in which the aqueous solution, thiourea and hydrochloric acid were dissolved. The concentration of zinc chloride in this solution was 0.001 M; the concentration of indium chloride was 0.005 M, and the concentration of thiourea was 0.5 M. By adding hydrochloride acid, the pH was controlled to be 2.5. A container containing this solution was placed in a hot water tank kept at 75° C. A substrate was prepared in advance by accumulating a $Cu(In,Ga)Se_2$ film on a Mo-coated glass plate. This substrate was dipped in the above-mentioned solution for about two minutes, and was then lifted out and washed with pure water.

Figure 8:
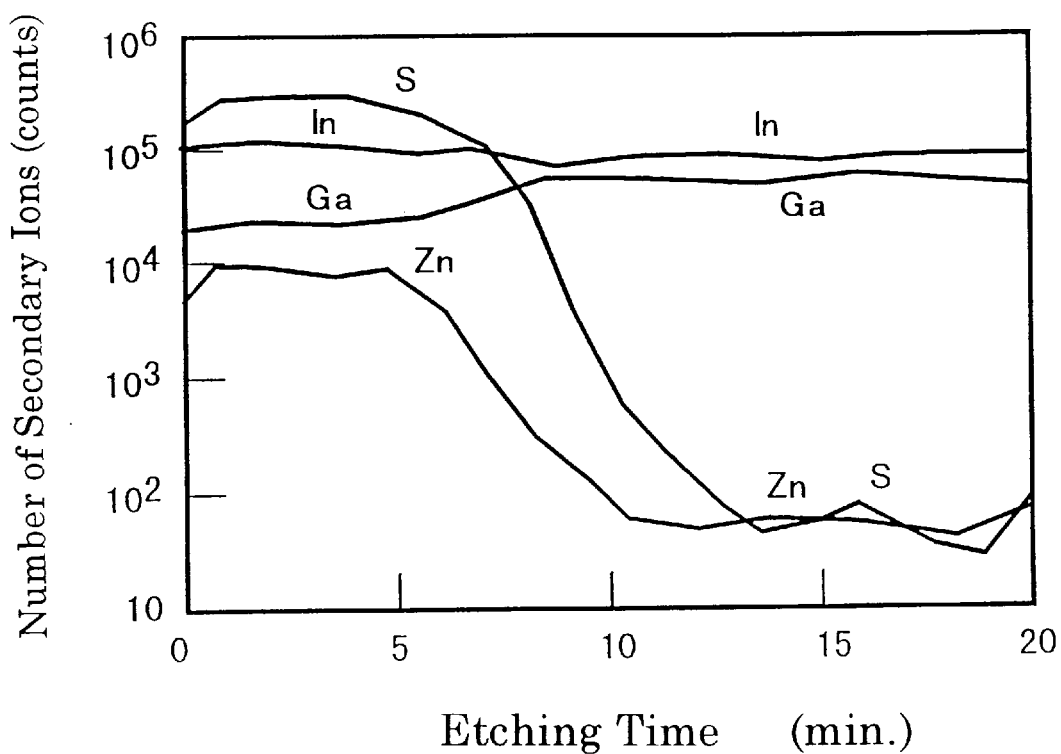
FIG. 8 is a graph showing the changes in composition in the film depth of a $Cu(In,Ga)Se_2$ film having a surface layer, formed by another embodiment of the manufacturing method of the present invention.

The composition of this $Cu(In,Ga)Se_2$ film in the film depth was examined by Secondary Ion Mass Spectroscopy (SIMS). The results are shown in FIG. 8. The horizontal axis of FIG. 8 indicates the etching time of the film, and 0 etching time corresponds to the top surface of the film. According to FIG. 8, Zn and S signals were detected in the surface layer up to five-minutes of etching time. On the other hand, inside the bulk after five-minutes of etching time or longer, Zn and S signals gradually decrease and decline to a noise level at about ten-minutes of etching time, The signal strength of Ga is constant inside the bulk, but the signal strength of Ga in the surface layer decreases as Ga gets closer to the surface. Moreover, in comparing the signal strength of Zn in the surface layer to the signal strength of In in the layer, it is found that the former is lower than the latter by a factor of ten. The difference in susceptibility of Zn and In by SIMS has to be considered, but it is thought that a small amount of Zn is contained in the surface layer. Thus, it is realized that the surface layer of the $Cu(In,Ga)Se_2$ has a lower Ga dissolving rate than the bulk, and that the layer is a $Cu(In,Ga)S_2$:Zn layer containing a small amount of Zn.

Thus, group IIb elements can be easily doped into the surface layer (chalcopyrite based semiconductor thin film). The chalcopyrite based semiconductor thin film to which group IIb elements are doped, particularly $CuInSe_2$:Zn or $CuInS_2$:Zn, shows n-type conduction. Since pn junctions are constituted by forming an n-type semiconductor layer on the surface of a p-type semiconductor, this example is useful for manufacturing $CuInSe_2$ based solar cells. In addition, by varying the concentration of zinc chloride in the solution, the concentration of Zn contained in the surface layer can be controlled, so that the carrier concentration of the n-type layer can be easily selected. As a result, the n-type layer is formed which is suitable for improving the conversion efficiency of solar cells.

Even though chlorides were used in this example as the salts containing group IIb element or group IIIb element, the same results are obtained also from iodide, bromide, sulfate, nitrate or the like. The same effects are obtained when sulfuric acid, nitric acid, acetic acid or the like is used as the acid. Furthermore, although Zn was used as the group IIb element in this example, the same n-type semiconductor surface layer can also be formed by using Cd.

Example 4

An example of forming a surface layer by using a solution containing group IVb elements is described in this example.

Indium chloride ($InCl_3$) was prepared as a compound (salt) containing group IIIb elements; and tin chloride ($SnCl_4$) was prepared as a compound (salt) containing group IVb elements. These two salts were dissolved in water, thus preparing an aqueous solution. Then, a solution was prepared by mixing the aqueous solution, thioacetamide and hydrochloric acid. The concentration of tin chloride in this solution was 0.0005 M; the concentration of indium chloride in the solution was 0.005 M; and the concentration of thioacetemide in the solution was 0.1 M. By adding hydrochloric acid, the pH was controlled to be 1. A container containing this solution was placed in a hot water tank kept at 70° C. A substrate was prepared in advance which had an accumulated $Cu(In,Ga)Se_2$ film on a Mo-coated glass plate. The substrate was dipped in the solution for about thirty seconds, and was then lifted out and washed with pure water.

Figure 9:
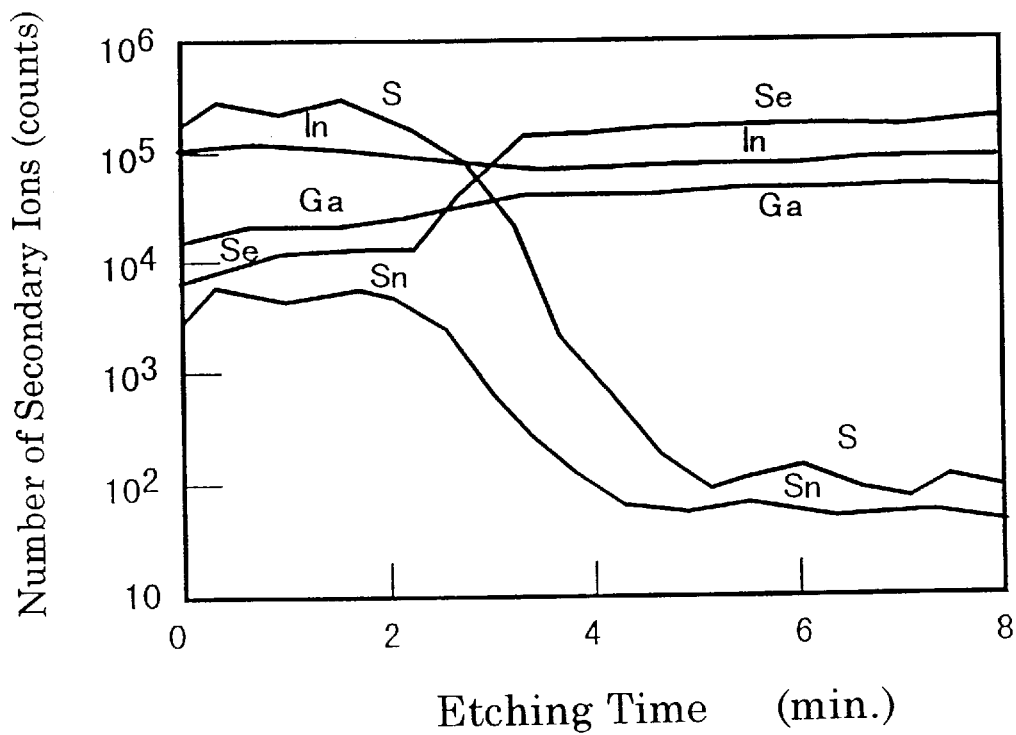
FIG. 9 is a graph showing the changes in compositions in the film depth of a $Cu(In,Ga)Se_2$ film having a surface layer, formed by another embodiment of the manufacturing method of the present invention.

The compositions of the $Cu(In,Ga)Se_2$ film in the film depth were examined with SIMS. The results are shown in FIG. 9. The horizontal axis of FIG. 9 indicates the etching time of the film, and 0 etching time corresponds to the top surface of the film. According to FIG. 9, Sn and S signals are detected in the surface layer up to two-minutes of etching time. At the same time, the signal strength of Se in the surface layer is much smaller than the signal strength inside the bulk after two-minutes of etching time. On the contrary, inside the bulk, Sn and S signal strengths decline to a great extent while the signal strength of Se increases. As in Example 3, the signal strength of Ga gradually decreases inside the surface layer as Ga gets closer to the surface. Moreover, the signal strength of Sn inside the surface layer is smaller than the signal strength of In in the layer by a factor of ten. As a result, it is found that the surface layer of the $Cu(In,Ga)Se_2$ film is a $Cu(In,Ga)S_2$:Sn layer containing a small amount of Sn and having a small Ga percentage content.

Thus, group IVb elements can be easily doped into the chalcopyrite based semiconductor thin film (surface layer). The chalcopyrite based semiconductor to which group IVb elements are doped becomes an n-type high resistor. A pin junction is constituted by forming an n-type low resistance film on a p-type semiconductor having this kind of n-type high resistance surface layer. In this case, it is possible to reduce leakage current generated at a pn junction with no surface layer, thus improving diode properties. More specifically, open end voltage and curve factors increase in solar cells by reducing leakage current, so that conversion efficiency improves. Based on the preferable properties of this example, the thickness of a semi-insulating layer, which impacts highly on diode properties, can be easily controlled by arranging dipping time, the concentration of salts containing the group IVb element or group 11b element, etc.

In this example, chlorides were used as the salts containing the group IIIb element or the group IVb element; however, the same results are obtained from iodide, bromide, sulfate, nitrate, or the like. The same results are also obtained when sulfuric acid, nitric acid, acetic acid or the like is used as acid.

Example 5

An example of manufacturing solar cells by using a semiconductor thin film having a surface layer is explained in this example.

A substrate was prepared in advance by accumulating a Cu(In,Ga)Se$_2$ film on a Mo-coated glass. The substrate was dipped in the same solution as in Example 1 for about ten seconds, and was then lifted out and washed with pure water. Conditions such as the concentrations of indium chloride and thioacetamide, the arrangement of pH by hydrochloric acid, liquid temperature, etc. were the same as in Example 1. Several Cu(In,Ga)Se$_2$ films were treated with heat for thirty minutes at different temperatures within the range 200–300° C.

CdS films, i.e. window layers of solar cells, were formed on the surface of the films, including the ones treated with heat and the ones without, by a chemical liquid deposition method. The CdS film more specifically was formed by dipping the substrate formed with an accumulated Cu(In, Ga)Se$_2$ film in a solution where cadmium acetate (Cd (CH$_3$COO)$_2$), thiourea, ammonium acetate and ammonia were dissolved. The concentrations of cadmium acetate, thiourea and ammonia acetate are 0.001 M, 0.005 M and 0.01 M respectively. By adding ammonia, the pH was controlled to be 11. The liquid temperature of a hot water tank was 85° C. After accumulating the CdS film, a ZnO film and ITO (In$_2$O$_3$:SnO$_2$) film were formed on the CdS film as transparent conductive layers by a sputtering method. The sputtering was carried out while 500 W high-frequency power was applied to the target in an Ar gas atmosphere at 80 mm Torr. The thickness of the ZnO film and the ITO film was 0.2 μm and 0.1 μm respectively.

The properties of the solar cell as prepared above were measured by irradiating artificial sunlight at 1.5 AM and 100 mW/cm$^2$ on the solar cell. Table 1 shows the properties. As a comparison, as a conventional cell, a CdS film was accumulated on the same Cu(In,Ga)Se$_2$ film with no surface layer of the present invention, and the properties of this conventional solar cell also are shown in the table. By carrying out a dipping treatment to the semiconductor thin film in a solution containing indium chloride and thioacetamide (called "In-S treatment" hereinafter), it is found that the conversion efficiency of solar cells improves. According to Table 1, curve factors show particular improvement. This improvement is thought to be due to the reduction in leakage current, which is generated at the pn junctions between CdS film and Cu(In,Ga)Se$_2$ film, by the surface layer formed in the In-S treatment. It is also found that the conversion efficiency of solar cells improves by carrying out the heat treatment after the In-S treatment. By carrying out the heat treatment, curve factors also improve probably due to the reduction in the density of defects on the surface layer. Moreover, in the range of 200–300° C. heat treatment temperature, 14% or more efficiency was obtained. If the temperature of the heat treatment is too high, efficiency would decline. This is probably because mutual dispersion occurs between the surface layer and the bulk by a high temperature heat treatment, thus forming a film having a uniform composition.

TABLE 1

| Sample | In—S Treatment | Heat Treatment (° C.) | Release Voltage (V) | Current Density (mA/cm$^2$) | Curve Factor | Conversion Efficiency (%) |
|---|---|---|---|---|---|---|
| 1 | No | No | 0.578 | 29.6 | 0.660 | 11.3 |
| 2 | Yes | No | 0.600 | 31.4 | 0.691 | 13.0 |
| 3 | Yes | 200 | 0.645 | 31.3 | 0.749 | 15.1 |
| 4 | Yes | 250 | 0.648 | 32.1 | 0.759 | 15.8 |
| 5 | Yes | 300 | 0.638 | 31.2 | 0.751 | 15.0 |
| 6 | Yes | 350 | 0.618 | 30.1 | 0.723 | 13.5 |
| 7 | Yes | 500 | 0.595 | 30.5 | 0.675 | 12.3 |

TABLE 1-continued

Figure 10:
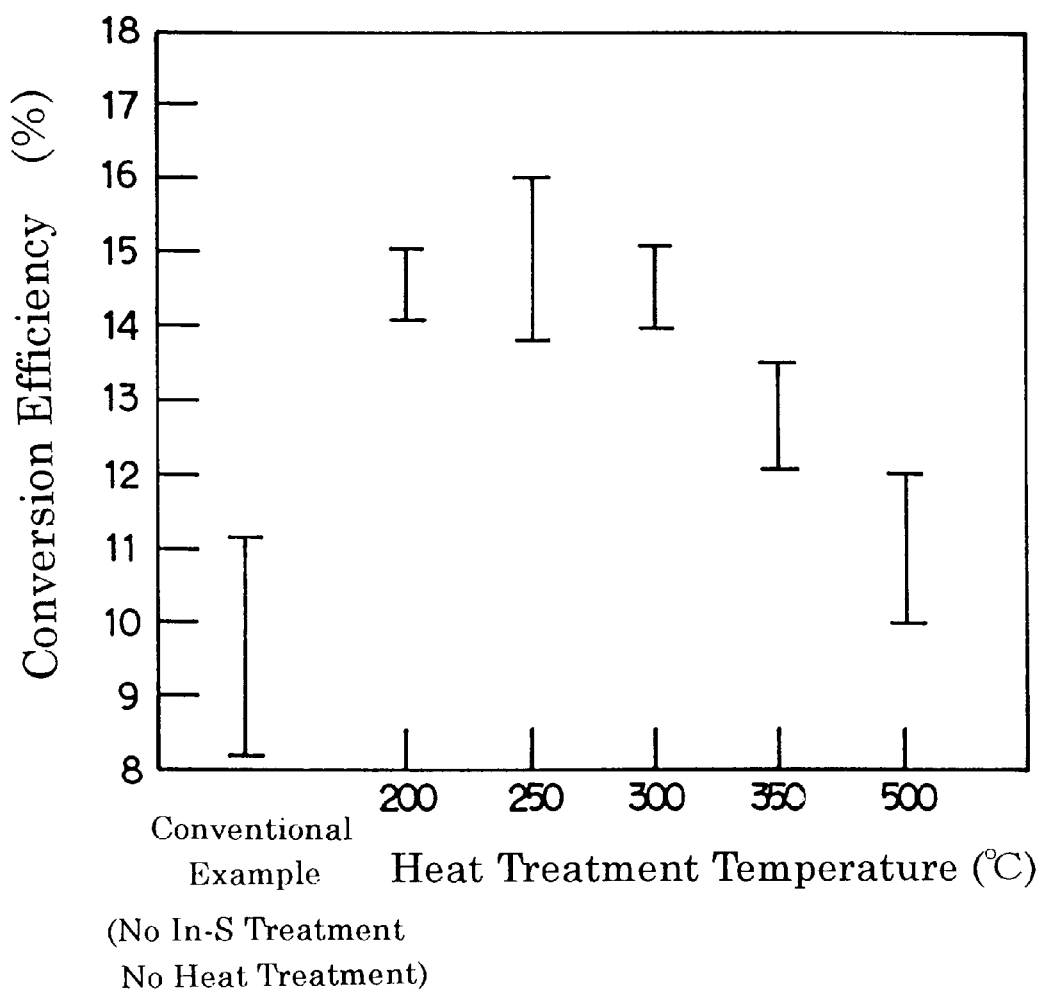
FIG. 10 is a graph showing the dispersion of conversion efficiency, in response to heat treatment temperature, of a CIGS solar cell which has a semiconductor thin film having a surface layer as a light absorbing layer and is formed by another embodiment of the manufacturing method of the present invention.

FIG. 10 shows the dispersion of efficiency of the solar cells. According to FIG. 10, the In—S treatment decreases the dispersion in the efficiency of the solar cell. Thus, in addition to the improvement in conversion efficiency, the reproducibility of the efficiency of solar cells also proves by forming a surface layer in the In—S treatment. It is also found that the reproducibility of efficiency would further improve by the heat treatment after the In—S treatment. The reproducibility is an important element so as to improve the evenness of conversion efficiency and yield from a large area.

Therefore, it was confirmed that the semiconductor thin film, having the surface layer by the method of the present invention, is effective in improving the conversion efficiency of solar cells and reproducibility. The heat treatment after the formation of the surface layer further improves the conversion efficiency and reproducibility.

Although the heat treatment was carried out in a nitrogen atmosphere in this example, the same effect can be obtained from carrying out the treatment in the atmosphere of an inert gas such as Ar, oxgyen gas or H$_2$S gas, in air, or in vacuum.

Example 6

Another example of manufacturing solar cells by using a semiconductor thin film having a surface layer is explained in this example.

As described above, in CIGS solar cells, the theoretical conversion efficiency, which is calculated from the forbidden band width of a light absorbing layer, is highest around the 0.7 composition ratio (x=around 0.7) of the Cu(In$_{1-x}$Ga$_x$)Se$_2$ film. However, in reality, the highest conversion efficiency is achieved at the 0.2–0.3 composition ratio (x=0.2–0.3). This difference in the ratio is probably caused by the fact that the surface of the CIGS film becomes a p-type or semi-insulating layer at a composition ratio more than (x>0.3), thus contaminating the pn junction interface with the window layer in the atmosphere. Therefore, in this example, a surface layer was formed on the Cu(In$_{0.3}$Ga$_{0.7}$)Se$_2$ film by the manufacturing method of the present invention so as to prepare a solar cell.

Using the same solution as in Example 2, a substrate was dipped for about one minute, and was then lifted out and washed with pure water. The substrate was prepared in advance by forming a Cu(In$_{0.3}$Ga$_{0.7}$)Se$_2$ film on a Mo-coated glass. The concentrations of indium chloride, zinc chloride and thiourea in the solution and the pH of the solution by hydrochloric acid were the same as in Example 2. After the washing process with pure water, the substrate was treated with heat at 200° C. in an Ar atmosphere for thirty minutes.

A solar cell was prepared using a Cu(In$_{0.3}$Ga$_{0.7}$)Se$_2$ film that has a surface layer by the solution treatment as a light absorbing layer; and as a comparison, a solar cell having a Cu(In$_{0.3}$Ga$_{0.7}$)Se$_2$ film, on which the solution treatment was not carried out as a light absorbing layer was prepared. The method of accumulating a CdS window layer on the light absorbing layer and of forming a ZnO/ITO transparent conductive lamination film are the same as in Example 5, including various conditions and the thickness of the layer and the film. The properties of the solar cells were examined by irradiating artificial sunlight at 1.5 AM and 100 mW/cm$^2$ on the solar cells. The results are shown in Table 2. It is found, according to the table, that the solar cell having the film on which the solution treatment was carried out had a higher Voc (open end voltage) and curve factor than the solar cell having the film to which the solution treatment was not carried out. This positive result is probably from the formation of an extremely thin n-type surface layer by the solution treatment, thus forming a pn junction inside the film and preventing the formation of defects at the pn junction interface caused by contamination with impurities, surface oxidation, etc. in the air.

TABLE 2

| Sample | Solution Treatment | Release Voltage (V) | Current Density (mA/cm$^2$) | Curve Factor | Conversion Efficiency (%) |
|---|---|---|---|---|---|
| 8 | No | 0.665 | 21.5 | 0.681 | 9.76 |
| 9 | Yes | 0.723 | 24.0 | 0.748 | 13.0 |

Contamination and scratches at a junction interface in the processes of manufacturing solar cells can be prevented by forming a pn junction as in this example. As a result, the improvement in conversion efficiency of solar cells becomes possible. Moreover, since the compositions between a film (bulk) and a surface layer—in this example, the compositions of $Cu(In,Ga)Se_2$ and $CuInS_2$—are different from each other, an n-type surface layer having a wider forbidden band width relative to a p-type bulk can be formed. In addition, the n-type surface layer can be designed to effectively operate as a window layer of a solar cell. Therefore, it becomes possible to simplify the manufacturing processes of solar cells, and improve mass-productivity and reproducibility.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes that come within the meaning and rule of equivalency of the claims are intended to embraced therein.

We claim:

1. A solar cell, comprising:

a substrate;

a back electrode formed on the substate;

a p-type chalcopyrite semiconductor thin film formed on the back electrode;

an n-type semiconductor thin film formed so as to constitute a pn junction with the p-type chalcopyrite thin film; and a transparent electrode formed on the n-type semiconductor thin film;

wherein a material having a higher resistivity than the p-type chalcopyrite semiconductor is formed between the p-type chalcopyrite semiconductor thin film and the n-type semiconductor thin film, and the material is formed on a plurality of grain boundaries on a surface of the p-type chalcopyrite semiconductor thin film in an island pattern.

2. A solar cell according to claim 1, wherein the material has a resistivity of at least $10^4$ Ω·cm.

3. A solar cell according to claim 1, wherein the p-type chalcopyrite comprises a group Ib element, a group IIIb element and a group VIb element; the group Ib element being at least one element selected from the group consisting of Cu and Ag; the group IIIb element being at least one element selected from the group consisting of In and Ga; and the group VIb element being at least one element selected from the group consisting of S, Se and Te.

4. A solar cell according to claim 3, wherein the material is a chalcopyrite based compound comprising a group Ib element, a group IIIb element and a group VIb element, said group Ib element being at least one element selected from the group consisting of Cu and Ag: said group IIIb element being at least one element selected from the group consisting of In and Ga; and said group VIb element being at least one element selected from the group consisting of S, Se and Te.

5. A solar cell according to claim 4, wherein the material comprises a different group IIIb element from the group IIIb element contained in the p-type chalcopyrite semiconductor thin film.

6. A solar cell according to claim 4, wherein the material comprises a different group VIb element from the group VIb element contained in the p-type chalcopyrite semiconductor thin film.

7. A solar cell according to claim 4, wherein the material is the chalcopyrite based compound, to which a group IIb element is doped.

8. A solar cell according to claim 7, wherein the group IIb element is at least one element selected from the group consisting of Zn and Cd.

9. A solar cell according to claim 4, wherein the material is the chalcopyrite based compound, to which a group IVb element is doped.

10. A solar cell according to claim 9, wherein the group IVb element is Sn.

11. A solar cell according to claim 4, wherein the material is at least one material selected from the group consisting of $CuInS_2$, $CuGaS_2$ and a mixed crystal of $CuInS_2$ and $CuGaS_2$.

12. A solar cell according to claim 3, wherein the p-type chalcopyrite semiconductor thin film is at least one thin film selected from the group consisting of $CuInSe_2$, $CuGaSe_2$, and a mixed crystal of $CuInSe_2$ and $CuGaSe_2$.

13. A solar cell according to claim 1, wherein the material is at least one material selected from the group consisting of $Al_2O_3$, $TiO_2$, $SiO_2$, ZnO, $ZrO_2$, $Si_3N_4$, $CaF_2$, $MgF_2$, AlN and mixtures thereof.

14. A solar cell according to claim 1, wherein the n-type semiconductor thin film is a CdS thin film.

15. A method of manufacturing a solar cell comprising the steps of:

forming a back electrode on a substrate;

forming a p-type chalcopyrite semiconductor thin film comprising a group Ib element, a group IIIb element and a group VIb element, on said back electrode;

forming a material, having a higher resistivity than the p-type chalcopyrite semiconductor, on the p-type chalcopyrite semiconductor thin film;

forming an n-type semiconductor thin film so as to establish a pn junction with the p-type chalcopyrite semiconductor thin film; and forming a transparent electrode on said n-type semiconductor thin film;

wherein the material is formed by contacting a solution, comprising a compound comprising a group IIIb element and a compound comprising a group VIb element to a surface of the p-type chalcopyrite semiconductor thin film.

16. A method according to claim 15, wherein the material is formed at least on grain boundaries on a surface of the p-type chalcopyrite semiconductor thin film.

17. A method according to claim 15, wherein the group Ib element is at least one element selected from the group consisting of Cu and Ag; wherein group IIIb element in the p-type chalcopyrite semiconductor thin film is at least one element selected from the group consisting of In and Ga; and wherein group VIb element in the p-type chalcopyrite semiconductor thin film is at least one element selected from the group consisting of S, Se and Te.

18. A method according to claim 15, wherein the solution further comprises a compound comprising a group IIb element.

19. A method according to claim 18 wherein the group IIb element is at least one element selected from the group consisting of Zn and Cd.

20. A method according to claim 15, wherein the solution further comprises a compound comprising a group IVb element.

21. A method according to claim 20, wherein the group IVb element is Sn.

22. A method according to claim 15, wherein the compound in the solution comprises a different group IIIb element from the group IIIb element contained in the p-type chalcopyrite semiconductor thin film.

23. A method according to claim 15, wherein the compound in the solution comprises a different group VIb element from the group VIb element contained in the p-type chalcopyrite semiconductor thin film.

24. A method according to claim 15, wherein the solution comprises at least one solvent selected from the group consisting of hydrochloric acid, acetic acid, nitric acid and sulfuric acid.

25. A method according to claim 15, wherein the solution has a pH of 1–4.

26. A method according to claim 15, wherein the solution is kept at 10–100° C.

27. A method according to claim 15, wherein the compound comprising a group IIIb element is at least one compound selected from the group consisting of a halide, an acetate, a nitrate and a sulfate of group IIIb elements.

28. A method according to claim 15, wherein the compound comprising a group VIb element is a nitrogen organic compound comprising a group VIb element.

29. A method according to claim 28, wherein the nitrogen organic compound comprising a group VIb element is at least one compound selected from the group consisting of thioacetamide and thiourea.

30. A method according to claim 18, wherein the compound comprising a group IIb element is at least one compound selected from the group consisting of a halide, an acetate, a nitrate and a sulfate of group IIb elements.

31. A method according to claim 20, wherein the compound comprising a group IVb element is at least one compound selected from the group consisting of a halide, an acetate, a nitrate and a sulfate of group IVb elements.

32. A method according to claim 15, further comprising the step of treating the p-type chalcopyrite semiconductor thin film and the material formed on said p-type chalcopyrite semiconductor thin film with heat.

33. A method according to claim 32, wherein the step is a heat treatment process carried out at 100–400° C.

* * * * *